United States Patent [19]

Smith

[11] Patent Number: 4,890,192

[45] Date of Patent: Dec. 26, 1989

[54] THIN FILM CAPACITOR

[75] Inventor: Lawrence N. Smith, Austin, Tex.

[73] Assignee: Microelectronics and Computer Technology Corporation, Austin, Tex.

[21] Appl. No.: 36,398

[22] Filed: Apr. 9, 1987

[51] Int. Cl.[4] .......................... H01G 1/01; H01L 27/00
[52] U.S. Cl. .................................... 361/313; 361/328; 29/25.42; 357/51
[58] Field of Search ............... 361/328, 329, 330, 306, 361/320-325, 311-313; 29/25.42; 357/51; 174/68.5

[56] References Cited

U.S. PATENT DOCUMENTS

| 3,113,253 | 12/1963 | Ishikawa et al. | 361/313 |
| 3,257,592 | 6/1966 | Maissel | 29/25.42 X |
| 3,603,850 | 9/1971 | Kirschner | 361/321 |
| 3,710,201 | 1/1973 | Ikeda | 361/501 |
| 3,745,430 | 7/1973 | Lunquist et al. | 361/306 X |
| 3,778,689 | 12/1973 | Bodway | 29/25.42 X |
| 3,882,059 | 5/1975 | Elderbaum | 361/321 X |
| 4,025,829 | 5/1977 | Makihara | 29/25.42 X |
| 4,074,340 | 2/1978 | Leigh | 361/321 |
| 4,136,291 | 1/1979 | Waldron | 307/308 |
| 4,190,854 | 2/1980 | Redfern | 357/51 |
| 4,238,762 | 12/1980 | McWilliams et al. | 357/50 X |
| 4,347,650 | 9/1982 | McLarney et al. | 29/25.42 |
| 4,401,843 | 8/1983 | Harper et al. | 361/306 X |
| 4,471,406 | 9/1984 | Sawairi | 361/328 |
| 4,476,518 | 10/1984 | Tsukahara | 361/328 |
| 4,527,180 | 7/1985 | Oto | 357/23.6 X |
| 4,561,039 | 12/1985 | Tsukahara | 361/328 |

Primary Examiner—Donald A. Griffin
Attorney, Agent, or Firm—Fulbright & Jaworski

[57] ABSTRACT

A thin film capacitor having a top, middle and bottom plate forming two capacitors in series in which the middle plate is a plurality of isolated plates thereby forming a structure of a plurality of two capacitors in series which are all connected in parallel. The capacitor may be integrated into an electronic substrate. The capacitor may be formed by depositing films of the metal conductors and dielectrics and may be formed as an integral part of a semiconductor chip or interconnect substrate.

9 Claims, 3 Drawing Sheets

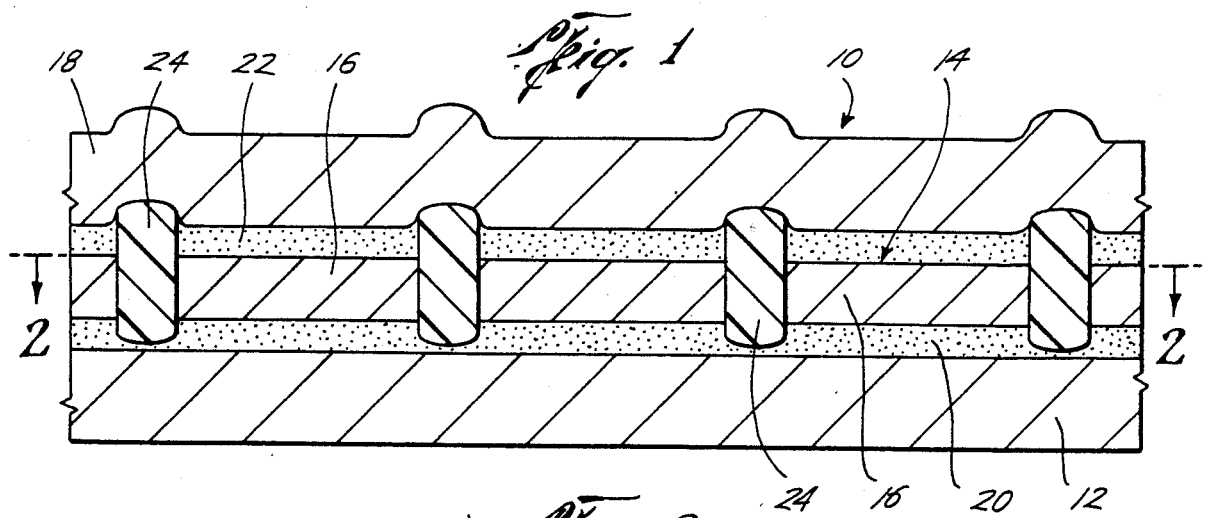
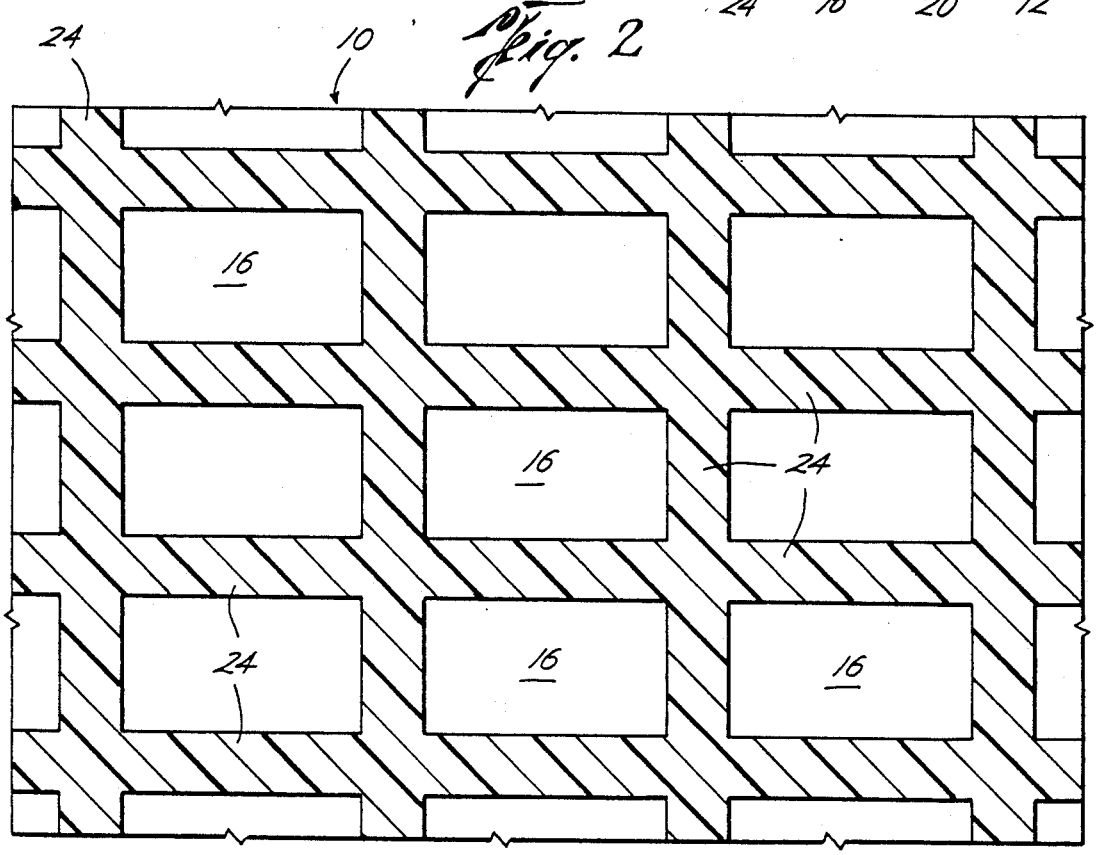
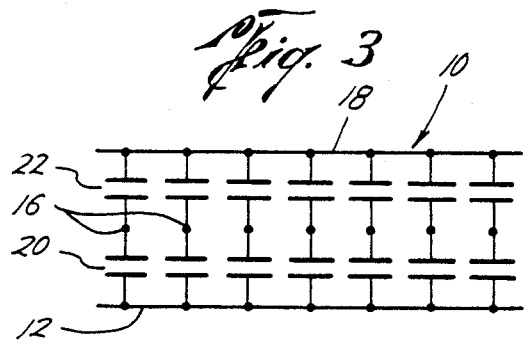
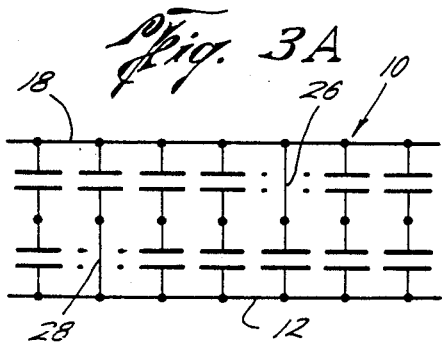

THIN FILM CAPACITOR

BACKGROUND OF THE INVENTION

Integrated thin film capacitors are desirable for power supply regulation of high performance electronic devices such as MOS and bipolar chips and other types of semiconductors. Specific capacitance required now is in the order of 50 nF/cm$^2$, and is expected to increase as still higher performance electronics become available. Integrating the capacitor into the substrate (on which the chips are mounted or which provides the interconnect between chips) is desirable because it would provide more usable area for the devices and would minimize the parasitic inductance between the chips and the capacitor. Even preferable would be to integrate the capacitor directly onto the chips themselves. However, the prime problem in fabricating such a capacitor is in the presence of point defects which short out the capacitor.

The present invention describes an apparatus and method for fabricating capacitors with specific capacitance much higher than is required near term, with high yield. The basic principle is to fabricate two capacitors in series: M1-I1-M2-I2-M3, where M refers to metal and I refers to a thin, high dielectric constant insulator. In addition, the middle metal film M2 is patterned into many, for example, a million, of individual isolated regions. This structure then provides a plurality of small area capacitors connected in parallel in which each capacitor consists of two capacitors in series. The entire structure will then be good so long as there are no simultaneous defects in both I1 and I2 at the same small area capacitor.

SUMMARY

The present invention is directed to an integrated thin film capacitor which includes first, second and third metallic conductor layers in which the first and second layers are separated by a first insulator layer, and the second and third layers are separated by a second insulator layer. The first and third conductors are continuous conductors and the second conductor is positioned between the first and second conductors and is a plurality of separated conductors whereby the three conductor layers form a plurality of two series connected capacitors which are all connected in parallel.

Still a further object of the present invention is wherein the integrated capacitor is formed as part of an electrical substrate wafer or directly integrated on integrated circuit chips.

Yet a further object of the present invention is wherein the metallic conductors include niobium or tantalum.

Yet a still further object of the present invention is the method of making a capacitor on an electronic substrate wafer including coating a substrate with a first thin film of metal, applying a first dielectric coating over the first metal film, fabricating a plurality of separated and spaced metal films on the dielectric coating, placing a second dielectric coating over the plurality of spaced metal films, and applying a second thin film of metal over the second dielectric coating.

Still a further object is wherein the plurality of spaced metal films are formed by depositing a coating of metal and anodizing spaced portions of the coating of metal.

Other and further objects, features and advantages will be apparent from the following description of presently preferred embodiments of the invention, given for the purpose of disclosure, and taken in conjunction with the accompanying drawings.

BRIEF DESCRIPTION OF THE DRAWINGS

FIG. 1 is an enlarged fragmentary, cross-sectional view of an integral thin film capacitor fabricated according to the present invention, FIG. 2 is a cross-sectional view taken along the line 2—2 of FIG. 1, FIG. 3 is an electrical schematic of the capacitor of FIGS. 1 and 2, FIG. 3A is an electrical schematic of the apparatus of FIG. 2 assuming two defects which do not overlap.

DESCRIPTION OF THE PREFERRED EMBODIMENT

Figure 4A:
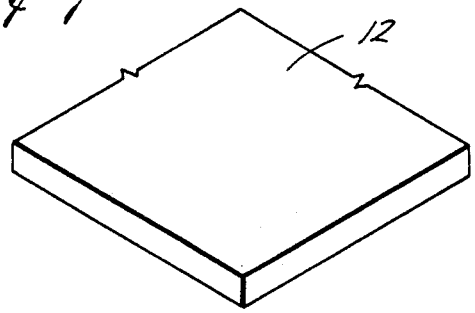
FIGS. 4A, 4B, 4C, 4D, 4E, and 4F are fragmentary elevational perspective views of the steps of manufacture of the apparatus of FIGS. 1 and 2.

While the present invention will be described, for purposes of illustration only, as forming an integral part of an electronic substrate such as a semiconductor chip or an interconnect substrate, the invention may be fabricated by other methods and be used in other applications. However, the present invention is particularly advantageous in its use in the power supply of a high performance chip to provide a substantially constant voltage. Typically, capacitors are mounted as close as possible to the chips and the present capacitor would have the advantage of minimizing electrical noise and increasing the performance of the chip.

Referring now to FIGS. 1 and 2, the capacitor of the present invention is generally indicated by the reference numeral 10 and includes several thin films of alternating conductors and insulators. For example, the capacitor may include a first metallic conductor layer 12 such as niobium or tantalum of a suitable thickness, for example, 5000 Angstroms. A middle layer 14 of a metallic conductor is provided which is formed in a plurality of spaced and separated conductors 16, for example of a thickness of 1000 Angstroms and a cross-sectional area of (40 um)$^2$ with 10 um separation between the conductors 16. A third metallic conductor layer 18 is provided, for example, of a thickness of 5000 Angstroms. A first thin high dielectric constant insulator 20 such as niobium oxide or tantalum oxide is provided between the metallic conductors 12 and 14. A second high dielectric constant insulator 22 is provided between the second layer 16 and the third layer 18 of the metallic conductors. The layers 20 and 22 may be of a thickness of 500 Angstroms and may be an oxide of the metal conductors used. The discrete conductors 16 are separated from each other by a dielectric 24 such as an anodized metal. For example only, the cross-sectional area of the capacitor 10 could be 100 cm$^2$.

The first 12 and third metal layers 18 may be patterned if desired, in the same manner in which a conventional capacitor may have patterned electrodes. Furthermore, electrical connection to the first or third metal layers 12 and 18 may be made by, for example etching, through both insulator layers and the middle electrode, again in substantially the same manner by which electrical contact can be made to both layers of a conventional capacitor.

Therefore, the capacitor 10 of the present invention, as best seen in the schematic in FIG. 3, consists of a plurality of two series connected capacitors in which the plurality of series connected capacitors are connected in parallel. However, the problem in fabricating such a capacitor 10 is that the insulating layers 20 and 22 are very thin and it is difficult to maintain and fabricate such insulators so as to prevent shorts in the capacitor 10. However, as best seen in FIG. 3A, the capacitor 10 of the present invention is defect insensitive. That is, assuming that a defect 26 and 28 or a short occurs in the capacitor 10, the defects do not short the overall capacitor 10 unless they both occur in the same two capacitors in series.

Figure 5:
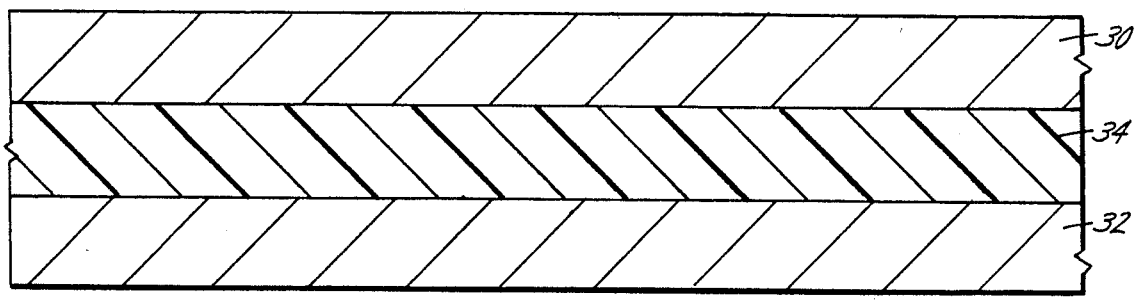
FIG. 5 is a cross-sectional view of a conventional prior art capacitor.
Figure 6:
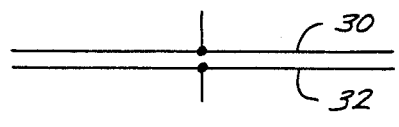
FIG. 6 is an electrical schematic of the capacitor of FIG. 5.
Figure 6A:
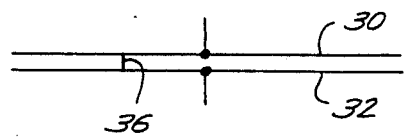
FIG. 6A is an electrical schematic illustrating the effect of a defect in the structure of FIG. 5.

This advantage is apparent from the prior art structure shown in FIGS. 5, 6 and 6A in which metallic conductors 30 and 32 are separated by a dielectric insulator 34 which is shown in schematic in FIG. 6. If a defect occurs in the insulator 34 at point 36 (FIG. 6A), the entire prior art capacitor is shorted out. While the prior art capacitor offhand appears to have a greater capacitance, because of its greater area and single dielectric layer, than the capacitance of the present invention, the present invention capacitor 10 more than compensates for this factor by its ability to use thinner dielectrics and larger areas, which results in a dramatic improvement in yield. That is, in an attempt to use the simple capacitor as shown in FIG. 5, the prior art would be required to use thicker dielectrics or even multiple layered dielectrics to obtain low defect density.

The capacitor 10 may be formed by typical layering techniques, such as used in the semiconductor art involving alternating layers of conductors and insulators and by the use of photolithography and/or etching.

Figure 4B:
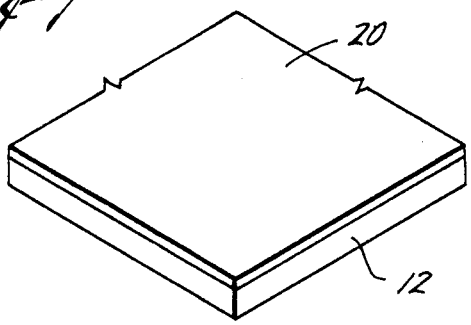
Figure 4C:
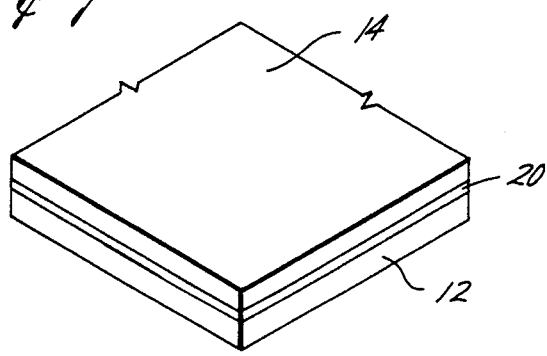

Referring now to FIG. 4A, a layer or film 12 of niobium is formed, as best seen in FIG. 4A, and as best seen in FIG. 4B is partially anodized or thermally oxidized to form a high dielectric insulator layer 20. The insulator 20 is then coated with a layer 14 of niobium.

Figure 4D:
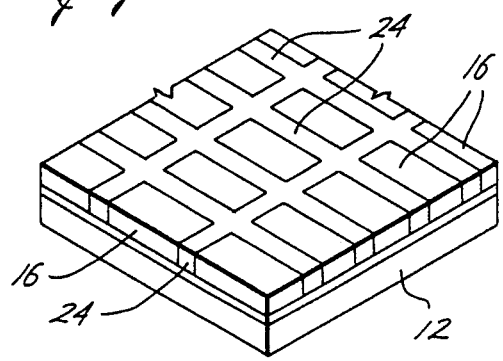
Figure 4E:
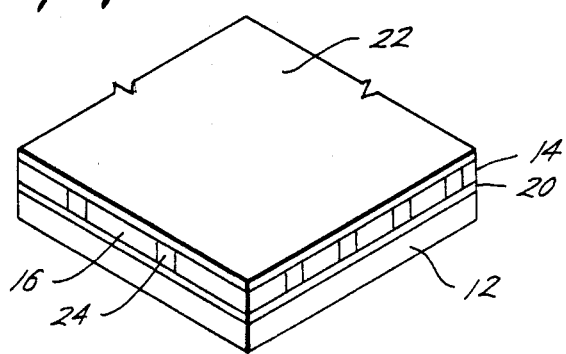
Figure 4F:
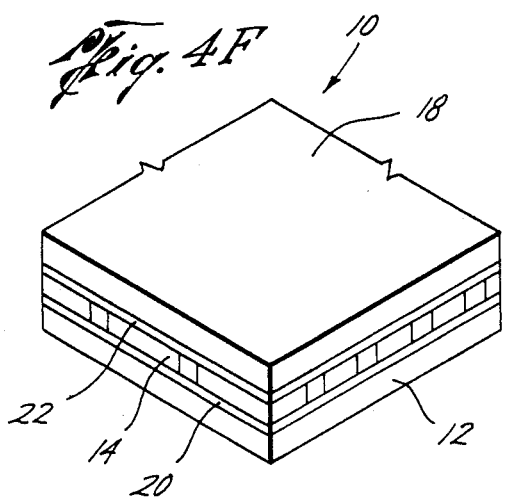

Next a conventional photoresist mask (not shown) is applied to the top surface of the layer 14, and a pattern is photolithographically printed on the resist mask, the resist mask is developed and cured, all as is conventional, to cover what will be the discrete conductors 16, as best seen in FIG. 4D, and the bare portions are anodized through the entire thickness of the second niobium layer, to form the insulator portions 24. Referring to 4E, the remaining niobium of layer 14 is partially anodized or thermally oxidized to provide the dielectric insulator layer 22. And as best seen in FIG. 4F a thin film of niobium metal 18 is applied on the top of the insulator layer 22 to complete the capacitor 10.

If desired, other metals and insulator layers may be used. For example, tantalum may be used for the metallic conductor layers 12, 14 and 18 and the insulators 20, 22 and 24 may use tantalum oxide. In addition, other methods of forming the metal conductors and insulators may be used, such as masking, and etching. Alternately, the layers 20 and 22 could be formed of other oxides or by other methods such as thermal oxidation.

Figure 7:
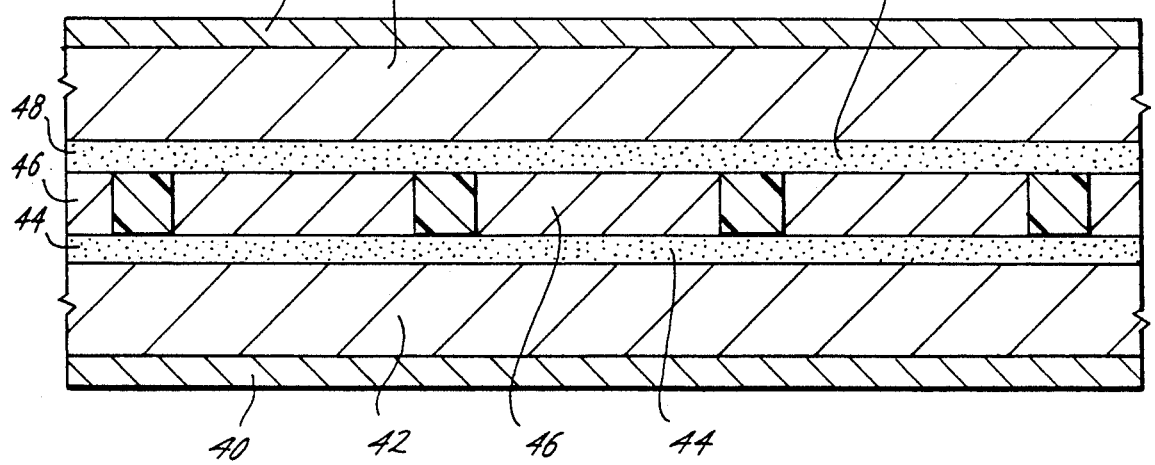
FIG. 7 is a fragmentary elevational view of another embodiment of the capacitor of the present invention.

Referring now to FIG. 7, another embodiment of the present invention is best seen in which a capacitor 10a fabricated using a first metallic conductor layer 40 which may be copper, a second layer of 42 of niobium whereby the layer of copper 40 could provide a low sheet resistance for the capacitor electrodes. An insulator layer 44 is provided which may be aluminum which can then be anodized to provide aluminum oxide. The second layer of metallic conductor 42 may be niobium or tantalum which may be patterned into the desired separated and spaced conductor segments 46 by etching. It is important that the spaces between the patterned middle electrodes 46 are filled with a thick insulator; otherwise those regions would be subject to shorts. Again, a second insulator layer 48 may be aluminum which is anodized into an oxide. Another layer of niobium 50 is provided and connected to a top layer of copper 52 for providing a low resistance.

The present invention, therefore, is well adapted to carry out the objects and attain the ends and advantages mentioned as well as others inherent therein. While a presently preferred embodiment of the invention has been given for the purpose of disclosure, numerous changes in the details of construction, arrangement of parts, and steps of the method, will be readily apparent to those skilled in the art and which are encompassed within the spirit of the invention and the scope of the appended claims.

What is claimed is:

1. An integrated thin film capacitor comprising,
   first, second and third metallic conductor layers,
   said first and second layer separated by a first insulator layer,
   said second and third layers separated by a second insulator layer,
   said second conductors positioned between said first and third conductors and being a plurality of separated conductors separated by insulators, and
   said first and third layers each forming an electrical connection to the capacitor and the first, second and third conductors forming a plurality of series connected capacitors, which series connected capacitors are connected in parallel.

2. The apparatus of claim 1 wherein said integrated capacitor is formed as part of an electrical substrate.

3. The apparatus of claim 2 wherein the conductors include niobium.

4. The apparatus of claim 2 wherein the conductors include tantalum.

5. The apparatus of claim 1 wherein said integrated capacitor is formed as a part of an integrated circuit chip.

6. The method of providing a capacitor on an electronic substrate wafer comprising,
   coating a substrate with a first thin film of metal,
   applying a first dielectric coating over the first metal film,
   fabricating a plurality of separated and spaced metal films on the dielectric coating, said metal films being separated by a dielectric insulator,
   placing a second dielectric coating over the plurality of spaced metal films,
   applying a third thin film of metal over the second dielectric coating, and
   forming electrical connections to the capacitor on the first and third films wherein the first, second and third films form a plurality of series connected capacitors, which series connected capacitors are connected in parallel.

7. The method of claim 6 wherein the metal films include niobium.

8. The method of claim 6 wherein the metal films include tantalum.

9. The method of claim 6 wherein the plurality of spaced metal films are formed by depositing a coat of metal, and
   anodizing to completion spaced portions of the coat of metal.

* * * * *